(12) United States Patent
Kim et al.

(10) Patent No.: US 8,912,865 B2
(45) Date of Patent: Dec. 16, 2014

(54) POWER COMBINER, POWER AMPLIFYING MODULE HAVING THE SAME, AND SIGNAL TRANSCEIVING MODULE

(75) Inventors: Ki Joong Kim, Jeollabuk-do (KR); Youn Suk Kim, Gyunggi-do (KR); Jun Goo Won, Gyunggi-do (KR); Jae Hyouck Choi, Gyunggi-do (KR); Sang Wook Park, Gyunggi-do (KR); Chul Hwan Yoon, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 491 days.

(21) Appl. No.: 13/220,229

(22) Filed: Aug. 29, 2011

(65) Prior Publication Data

US 2012/0249262 A1 Oct. 4, 2012

(30) Foreign Application Priority Data

Apr. 4, 2011 (KR) .................. 10-2011-0030619

(51) Int. Cl.
*H03H 7/38* (2006.01)
*H03H 7/42* (2006.01)
(Continued)

(52) U.S. Cl.
CPC *H03H 7/42* (2013.01); *H01L 25/16* (2013.01);
(Continued)

(58) Field of Classification Search
USPC ........... 333/119, 131; 307/17, 83; 330/124 R, 330/195, 197, 295
See application file for complete search history.

(56) References Cited

U.S. PATENT DOCUMENTS 7,068,104 B2 6/2006 Burns et al.
7,746,174 B2 6/2010 Yang et al.
(Continued)

FOREIGN PATENT DOCUMENTS

CN 101488729 A 7/2009
CN 101730209 A 6/2010
JP 3077198 8/2000

OTHER PUBLICATIONS

German Office Action with English Translation issued in German Application No. 10 2011 109 982.8 issued on May 24, 2012.

(Continued)

*Primary Examiner* — Robert Pascal
*Assistant Examiner* — Kimberly Glenn
(74) *Attorney, Agent, or Firm* — McDermott Will & Emery LLP

(57) ABSTRACT

There are provided a power combiner implemented by a printed circuit board, a power amplifying module having the same, and a signal transceiving module. The power combiner includes: a primary wiring unit formed on one surface of a printed circuit board, receiving a plurality of balance signals having positive balance signals and negative balance signals, and including a plurality of positive primary wirings and a plurality of negative primary wirings, wherein the plurality of positive primary wirings are spaced apart from each other by a predetermined interval, the plurality of negative primary wirings are spaced apart from each other by a predetermined interval, one ends of the plurality of positive primary wirings are connected in common to thereby receive the plurality of positive balance signals, one ends of the plurality of negative primary wirings are connected in common to thereby receive the plurality of negative balance signals, and the other ends of the plurality of positive primary wirings and the other ends of the plurality of negative primary wirings are connected to each other to thereby form a loop; and a secondary wiring unit formed on the other surface of the printed circuit board, and including a secondary wiring combining powers of the plurality of balance signals from the primary wirings forming the loop to thereby output a single end signal.

42 Claims, 12 Drawing Sheets

(51) Int. Cl.
  *H03F 3/60* (2006.01)
  *H03H 7/48* (2006.01)
  *H03F 3/21* (2006.01)
  *H01L 25/16* (2006.01)
  *H01L 23/66* (2006.01)
  *H05K 1/16* (2006.01)

(52) U.S. Cl.
  CPC ......... *H03F 2200/537* (2013.01); *H03F 3/602* (2013.01); *H03H 7/48* (2013.01); *H03F 2200/541* (2013.01); *H01L 23/66* (2013.01); *H03F 3/211* (2013.01); *H05K 1/165* (2013.01)
  USPC ............................. 333/131; 333/119; 330/295

(56) References Cited

U.S. PATENT DOCUMENTS

| | | |
|---|---|---|
| 7,880,547 B2 * | 2/2011 | Lee et al. ..................... 330/295 |
| 2009/0174477 A1 | 7/2009 | Lee et al. |
| 2010/0093292 A1 | 4/2010 | Kim et al. |
| 2010/0148866 A1 | 6/2010 | Lee et al. |

OTHER PUBLICATIONS

Ichiro Aoki et al., "Fully Integrated CMOS Power Amplifier Design Using the Distributed Active-Transformer Architecture," IEEE Journal of Solid-State Circuits, vol. 37, No. 3, Mar. 2002.

Chinese Office Action issued in corresponding Chinese Application No. 201110256447.1, dated Sep. 30, 2014, with English translation.

* cited by examiner

POWER COMBINER, POWER AMPLIFYING MODULE HAVING THE SAME, AND SIGNAL TRANSCEIVING MODULE

CROSS-REFERENCE TO RELATED APPLICATIONS

This application claims the priority of Korean Patent Application No. 10-2011-0030619 filed on Apr. 4, 2011, in the Korean Intellectual Property Office, the disclosure of which is incorporated herein by reference.

BACKGROUND OF THE INVENTION

1. Field of the Invention

The present invention relates to a power combiner implemented by a printed circuit board, a power amplifying module having the same, and a signal transceiving module.

2. Description of the Related Art

The use of wireless communications devices has recently increased due to the reasons such as functionality, portability, and the like, for users.

An amplifying element amplifying signals and a power combiner combining amplified signal powers are indispensably used in wireless communications devices.

According to the related art, the above-mentioned amplifying element has been manufactured via a gallium arsenide (Ga—As) process. However, there is a current trend towards manufacturing the amplifying element via a complementary metal oxide semiconductor (CMOS) process, in order to reduce manufacturing costs.

The power combiner indispensably used together with the amplifying element manufactured via the CMOS process is implemented by a transformer in an integrated passive device (IPD) scheme. Since the transformer in the IPD scheme may incur relatively high manufacturing costs, manufacturing the amplifying element via the CMOS process in order to reduce the manufacturing costs becomes meaningless.

That is, the power combiner according to the related art was implemented by the IPD transformer, such that manufacturing costs thereof were increased.

SUMMARY OF THE INVENTION

An aspect of the present invention provides a power combiner implemented by a printed circuit board, having reduced manufacturing costs, as compared to the power combiner implemented by the IPD transformer according to the related art, a power amplifying module having the same, and a signal transceiving module.

According to an aspect of the present invention, there is provided a power combiner including: a primary wiring unit formed on one surface of a printed circuit board, receiving a plurality of balance signals having positive balance signals and negative balance signals, and including a plurality of positive primary wirings, each provided to correspond to a plurality of positive balance signals and a plurality of negative primary wirings each provided to correspond to a plurality of negative balance signals, wherein the plurality of positive primary wirings are spaced apart from each other by a predetermined interval, the plurality of negative primary wirings are spaced apart from each other by a predetermined interval, one ends of the plurality of positive primary wirings are connected in common to thereby receive the plurality of positive balance signals, one ends of the plurality of negative primary wirings are connected in common to thereby receive the plurality of negative balance signals, and the other ends of the plurality of positive primary wirings and the other ends of the plurality of negative primary wirings are connected to each other to thereby form a loop; and a secondary wiring unit formed on the other surface of the printed circuit board, which is different from the one surface having the primary wiring unit formed thereon, and including a secondary wiring combining powers of the plurality of balance signals from the primary wirings forming the loop to thereby output a single end signal.

The primary wiring unit may further include an input pad having at least one positive input pad receiving the plurality of positive balance signals and transferring the plurality of positive balance signals to one ends of the positive primary wirings connected in common and at least one negative input pad receiving the plurality of negative balance signals.

The primary wiring unit may further include a first capacitor formed between the at least one positive input pad and the at least one negative input pad or further include a plurality of capacitors each formed between the plurality of positive primary wirings and the plurality of negative primary wirings.

The primary wiring unit may further include a connection pad through which the other ends of the plurality of positive primary wirings and the other ends of the plurality of negative primary wirings are connected to each other in common.

The connection pad may have a preset driving power supplied thereto.

The secondary wiring unit may further include an output pad outputting the single end signal, and the secondary wiring may have one end connected to a ground and the other end connected to the output pad.

The primary wiring unit may further include: a first output pad electrically connected to the output pad of the secondary wiring unit; a second output pad electrically connected to the ground through a bonding wire; and a second capacitor formed between the first and second output pads.

A ground pad to which one end of the secondary wiring is connected may have a preset inductance and form a first notch filter removing a second harmonic component of the single end signal.

The bonding wire may have a preset inductance and form a second notch filter removing a third harmonic component of the single end signal.

The primary wiring unit may be formed on an upper surface of the printed circuit board and the secondary wiring unit may be formed on a lower surface thereof.

The power combiner may further include first and second printed circuit boards. Here, the primary wiring unit may be formed on one surface of the first printed circuit board, the secondary wiring unit may be formed on one surface of the second printed circuit board, and the second printed circuit board may be positioned to be spaced apart from a lower portion of the first printed circuit board by a predetermined distance.

The primary wiring unit may include three positive primary wirings and three negative primary wirings or two positive primary wirings and two negative primary wirings.

According to another embodiment of the present invention, there is provided a power amplifying module including: a power amplifier including a plurality of amplifying units each receiving a plurality of balance signals having positive balance signals and negative balance signals and each amplifying the received plurality of balance signals; and a power combiner including a primary wiring unit formed on one surface of a printed circuit board and including a plurality of positive primary wirings each provided to correspond to a plurality of positive balance signals and a plurality of negative primary wirings each provided to correspond to a plurality of negative balance signals, wherein the plurality of positive primary wirings are spaced apart from each other by a predetermined interval, the plurality of negative primary wirings are spaced apart from each other by a predetermined interval, one ends of the plurality of positive primary wirings are connected in common to thereby receive the plurality of positive balance signals, one ends of the plurality of negative primary wirings are connected in common to thereby receive the plurality of negative balance signals, and the other ends of the plurality of positive primary wirings and the other ends of the plurality of negative primary wirings are connected to each other to thereby form a loop, and a secondary wiring unit formed on the other surface of the printed circuit board, which is different from the one surface having the primary wiring unit formed thereon, and including a secondary wiring combining powers of the plurality of balance signals from the primary wirings forming the loop to thereby output a single end signal.

According to another embodiment of the present invention, there is provided a signal transceiving module including: a power amplifier including a plurality of amplifying units each receiving a plurality of balance signals having positive balance signals and negative balance signals and each amplifying the received plurality of balance signals; a power combiner including a primary wiring unit formed on one surface of a printed circuit board and including a plurality of positive primary wirings each provided to correspond to a plurality of positive balance signals and a plurality of negative primary wirings each provided to correspond to a plurality of negative balance signals, wherein the plurality of positive primary wirings are spaced apart from each other by a predetermined interval, the plurality of negative primary wirings are spaced apart from each other by a predetermined interval, one ends of the plurality of positive primary wirings are connected in common to thereby receive the plurality of positive balance signals, one ends of the plurality of negative primary wirings are connected in common to thereby receive the plurality of negative balance signals, and the other ends of the plurality of positive primary wirings and the other ends of the plurality of negative primary wirings are connected to each other to thereby form a loop, and a secondary wiring unit formed on the other surface of the printed circuit board, which is different from the one surface having the primary wiring unit formed thereon, and including a secondary wiring combining powers of the plurality of balance signals from the primary wirings forming the loop to thereby output a single end signal; and a radio frequency (RF) switch switching between an output path of the single end signal output from the power combiner and a path of a reception signal received from the outside.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
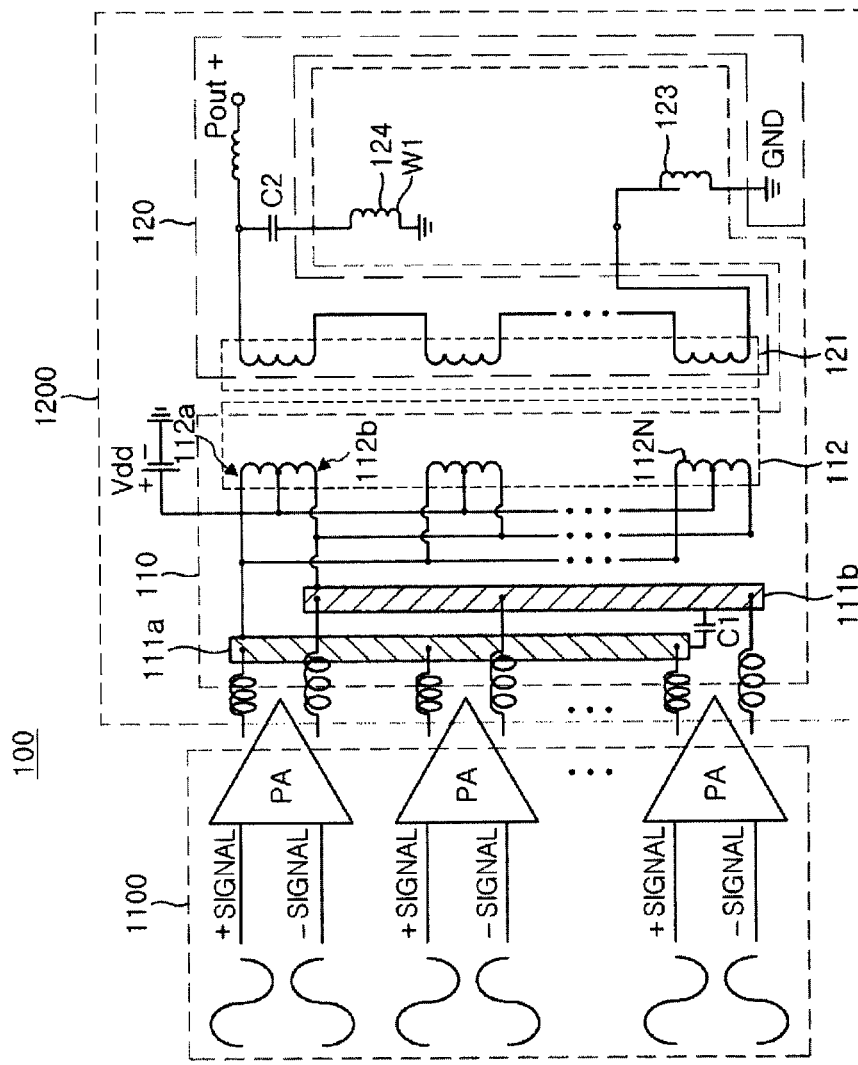
FIG. 1 is a schematic circuit diagram of a power amplifying module according to an embodiment of the present invention.

Embodiments of the present invention will now be described in detail with reference to the accompanying drawings such that they could be easily practiced by those having skill in the art to which the present invention pertains. However, in describing the embodiments of the present invention, detailed descriptions of well-known functions or constructions will be omitted so as not to obscure the description of the present invention with unnecessary detail.

In addition, like reference numerals denote like elements throughout the drawings.

Unless explicitly described to the contrary, the word "comprise" and variations such as "comprises" or "comprising," will be understood to imply the inclusion of stated elements but not the exclusion of other elements.

Embodiments of the present invention will now be described in detail with reference to the accompanying drawings.

FIG. 1 is a schematic circuit diagram of a power amplifying module according to an embodiment of the present invention.

Referring to FIG. 1, a power amplifying module 100 according to an embodiment of the present invention may include a power amplifier 1100 and a power combiner 1200.

The power amplifier 1100 may include a plurality of power amplifying units (PAs), wherein each of the plurality of power amplifying units (PAs) may amplify a power level of an input balance signal and transfer the amplified power to the power combiner 1200. The above-mentioned power amplifier 1100 may be formed by a complementary metal oxide semiconductor (CMOS) process.

The power combiner 1200 may include a primary wiring unit 110 and a secondary wiring unit 120, wherein the primary wiring unit 110 may receive a plurality of balance signals amplified in the power amplifier 1100 and the secondary wiring unit 120 may combine the plurality of balance signal powers and output the combined power as a single end signal.

The primary wiring unit 110 may include an input pad 111 and a plurality of primary wirings 112 each receiving the plurality of balance signals amplified in the power amplifier 1100. Here, the number of the plurality of primary wirings 112 may correspond to the number of the plurality of power amplifying units (PAs) of the power amplifier 1100. In addition, the power combiner 1200 may include a first notch filter 123 removing a second harmonic component of the output single end signal and a second notch filter 124 removing a third harmonic component thereof.

The secondary wiring unit 120 may include a secondary wiring 121 electromagnetically coupled to the plurality of primary wirings 112 to thereby combine the powers of the balance signals.

The power combiner according to the embodiment of the present invention will now be described in detail with reference to the accompanying drawings.

Figure 2A:
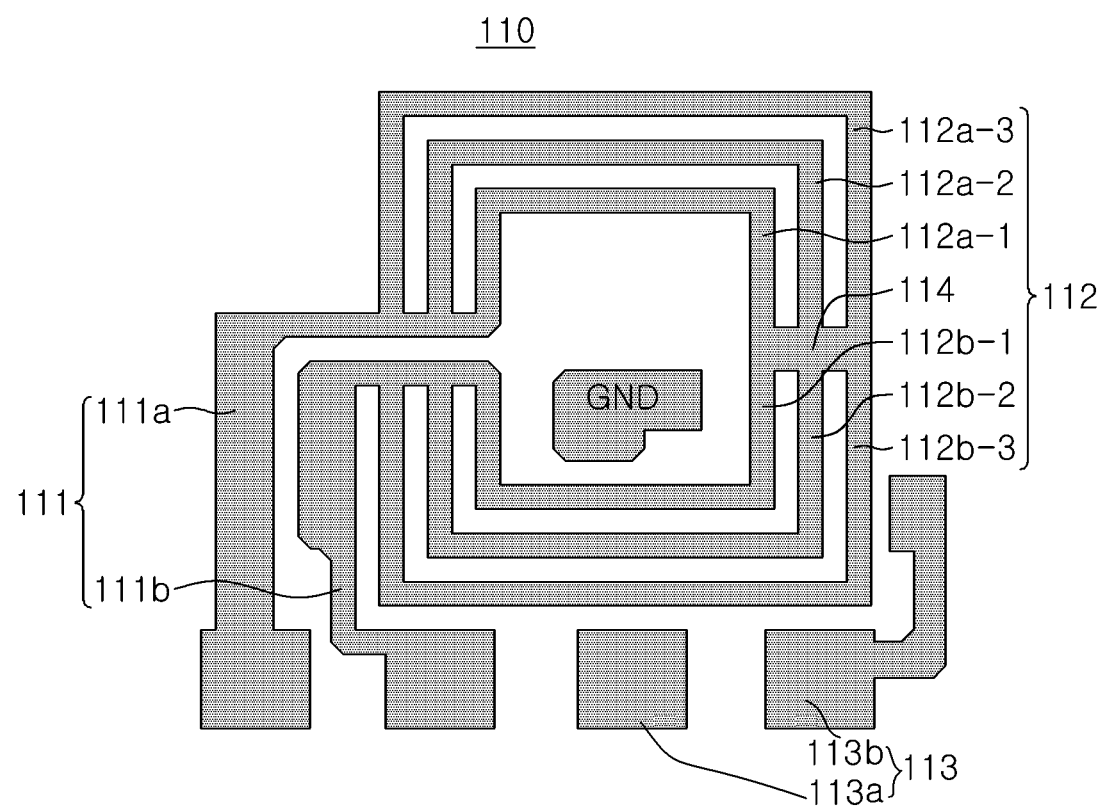
FIG. 2A is a view schematically showing an embodiment of a primary winding of a power combiner according to the present invention.
Figure 2B:
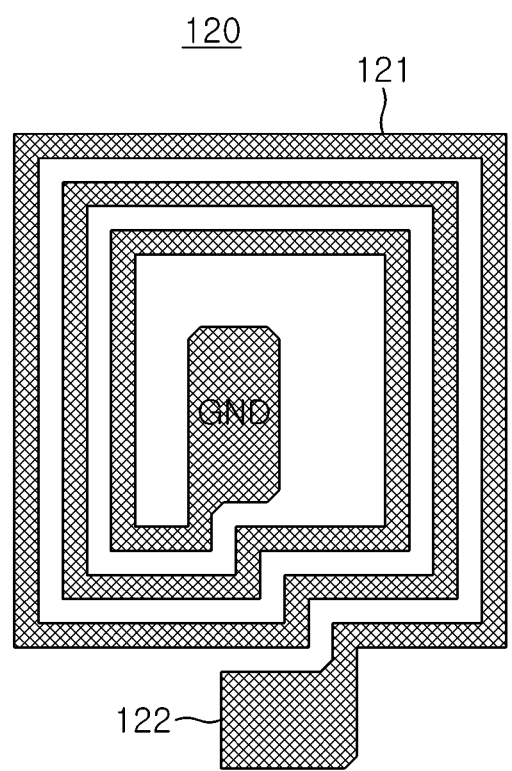
FIG. 2B is a view schematically showing an embodiment of a secondary winding of the power combiner according to the present invention.
Figure 2C:
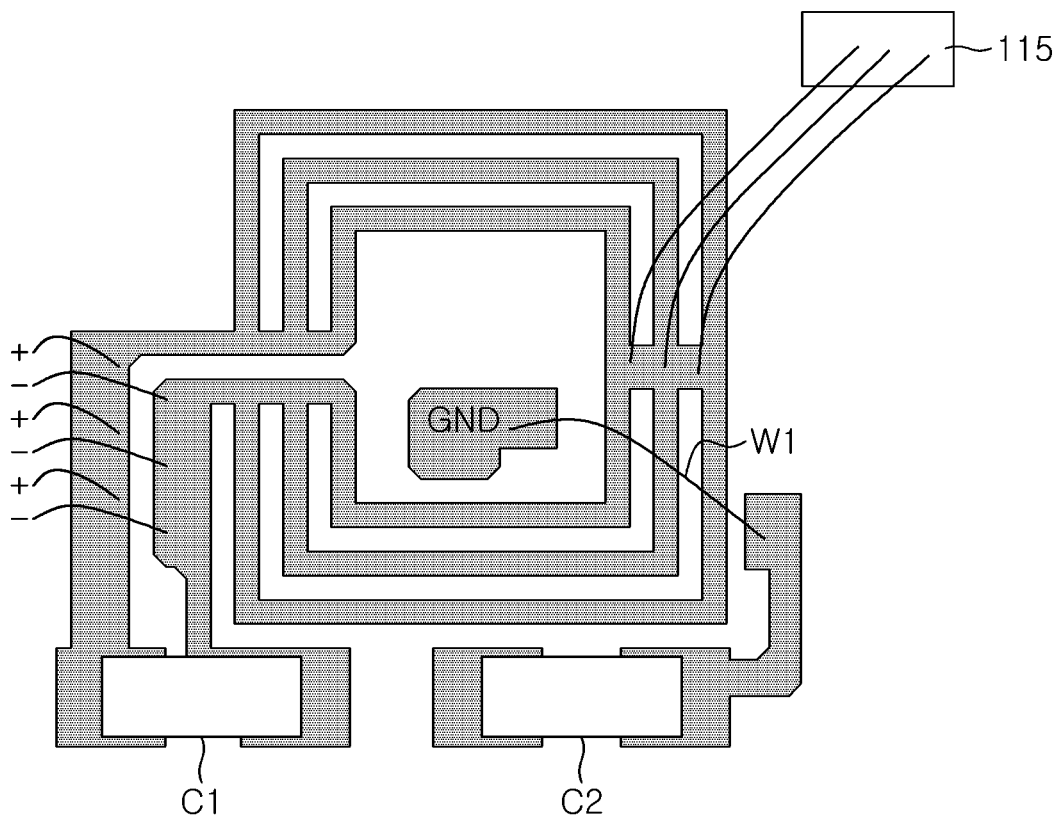
FIG. 2C is a view schematically showing an embodiment in which a circuit of the power combiner shown in FIG. 1 is implemented in the embodiment of the primary winding of FIG. 2A.
Figure 2D:
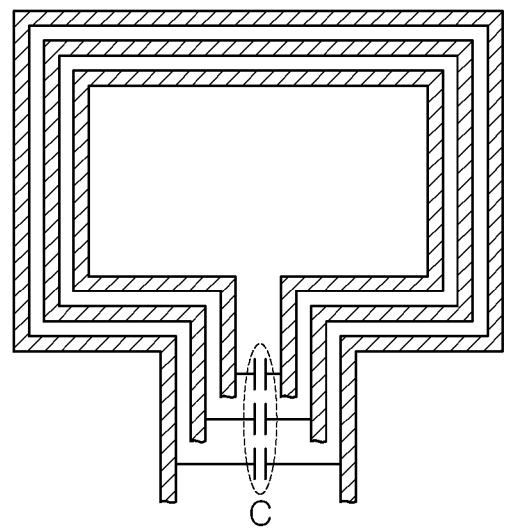
FIG. 2D is a view schematically showing another embodiment of a primary winding.
Figure 2E:
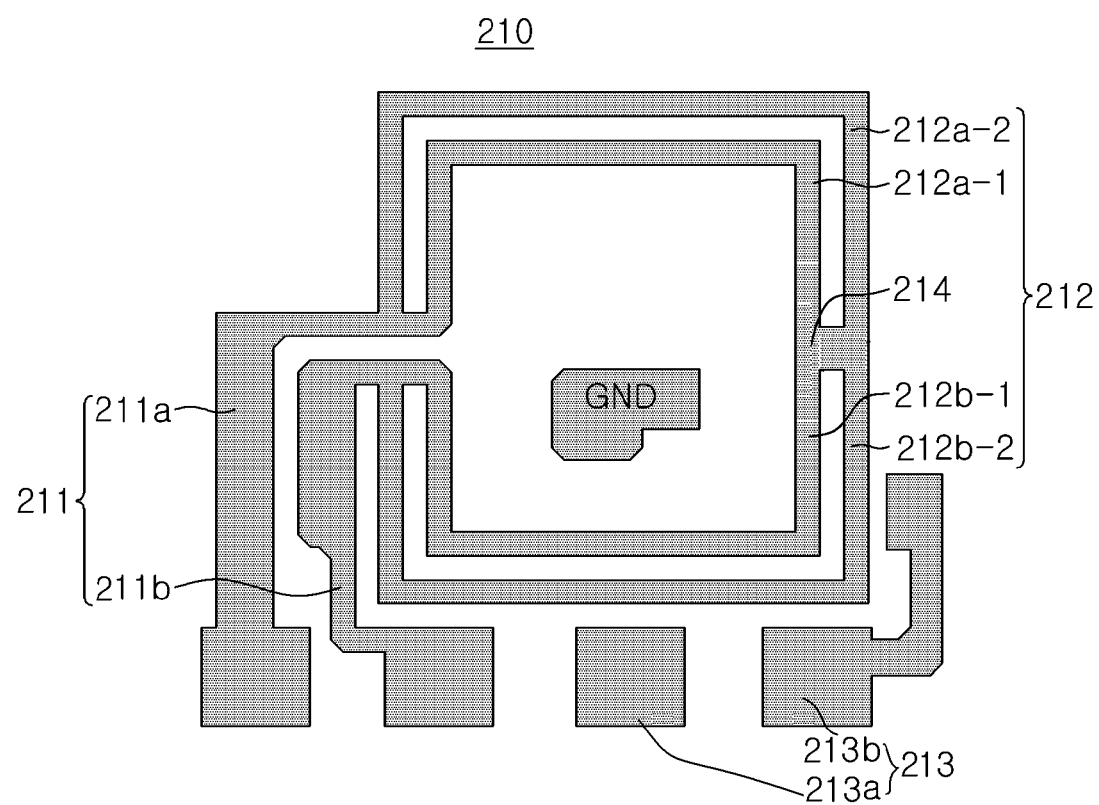
FIG. 2E is a view schematically showing another embodiment of a primary winding.

FIG. 2A is a view schematically showing an embodiment of a primary winding of the power combiner according to the present invention, FIG. 2B is a view schematically showing an embodiment of a secondary winding of the power combiner according to the present invention, FIG. 2C is a view schematically showing an embodiment in which a circuit of the power combiner shown in FIG. 1 is implemented in the embodiment of the primary winding of FIG. 2A, FIG. 2D is a view schematically showing another embodiment of a primary winding, and FIG. 2E is a view schematically showing another embodiment of a primary winding.

Referring to FIGS. 1, 2A and 2C, the primary wiring unit 110 may include the input pad 111 and the plurality of primary windings 112. The primary wiring unit 110 may be formed on one surface of a printed circuit board having a predetermined width and be formed as a conductor.

The input pad 111 may include a positive input pad 111a receiving positive balance signals of the plurality of balance signals and a negative input pad 111b receiving negative balance signals of the plurality of balance signals. The positive input pad 111a may be electrically connected to one ends of each of a plurality of positive primary wirings 112a-1, 112a-2, and 112a-3 of the plurality of primary wirings 112 and the negative input pad 111b may be electrically connected to one ends of each of a plurality of negative primary wirings 112b-1, 112b-2, and 112b-3 of the plurality of primary wirings 112.

As described above, the number of the primary wirings 112 may correspond to the number of the power amplifying units (PAs). For example, as shown in FIGS. 1 and 2A, when three power amplifying units (PAs) are provided, three primary windings 112 may be provided. Therefore, three positive primary wirings 112a-1, 112a-2, and 112a-3 receiving the positive balance signals of the balance signals of each of the power amplifying units (PAs) may be provided and three negative primary wirings 112b-1, 112b-2, and 112b-3 receiving the negative balance signals of the balance signals may be provided.

Meanwhile, the other ends of the positive primary wirings 112a-1, 112a-2, and 112a-3 and the other ends of the negative primary wirings 112b-1, 112b-2, and 112b-3 may be electrically connected to each other to thereby form a loop. That is, the other end of a first positive primary wiring 112a-1 and the other end of a first negative primary wirings 112b-1 may be connected to each other to thereby form a first loop, the other end of a second positive primary wiring 112a-2 and the other end of a second negative primary wirings 112b-2 may be connected to each other to thereby form a second loop, and the other end of a third positive primary wiring 112a-3 and the other end of a third negative primary wirings 112b-3 may be connected to each other to thereby form a third loop.

The other ends of the positive primary wirings 112a-1, 112a-2, and 112a-3 and the other ends of the negative primary wirings 112b-1, 112b-2, and 112b-3 may be connected to each other in common through a connection pad 114. The connection pad 114 may receive a driving power Vdd from a transfer pad 115 transferring the driving power Vdd having a voltage level preset from the outside.

In addition, the positive input pad 111a and the negative input pad 111b may include a first capacitor C1 formed therebetween, and first and second output pads 113a and 113b receiving an output from the secondary wiring unit 120 may include a second capacitor C2 formed therebetween. Further, the second output pad 113b and a ground pad GND within the first loop may be electrically connected to each other through a bonding wire W1 to form the second notch filter 124 removing the third harmonic component of the output single end signal.

Meanwhile, referring to FIG. 2D, when three power amplifying units are provided, three primary wirings may be provided. Therefore, three positive primary wirings receiving the positive balance signals of the balance signals of each of the power amplifying units (PAs) may be provided and three negative primary wirings receiving the negative balance signals of the balance signals may be provided. On the other hand, the three positive primary wirings and the three negative primary wirings may include three capacitors C each formed therebetween. The number of capacitors C may correspond to the number of primary wirings.

In addition, the power amplifier according to the embodiment of the present invention may be used in various mobile communications schemes such as a global system for mobile communications (GSM), a personal communications service (PCS), or the like. As shown in FIG. 2A or 2D, when three power amplifying units (PAs) are provided, such that three primary wirings 112 are provided, a power of the signal input to the primary wiring 112 may be 35 dBm. Therefore, a frequency range of the signal may correspond to a low band. This configuration may be used in a mobile communications scheme such as a GSM 580, an extended GSM (EGSM), or the like.

Meanwhile, referring to FIG. 2E, two primary wirings 212 may be used. Therefore, two positive primary wirings 212a-1 and 212a-2 receiving the positive balance signals of the balance signals of each of the power amplifying units (PAs) may be provided and two negative primary wirings 212b-1 and 212b-2 receiving the negative balance signals of the balance signals may be provided. Likewise, the other ends of the positive primary wirings 212a-1 and 212a-2 and the other ends of the negative primary wirings 212b-1 and 212b-2 may be connected to each other in common through a connection pad 214. In addition, an input pad 211 may include a positive input pad 211a electrically connected to one ends of each of a plurality of positive primary wirings 212a-1 and 212a-2 of a plurality of primary wirings 212 and receiving positive balance signals of the plurality of balance signals and a negative input pad 211b electrically connected to one ends of each of a plurality of negative primary wirings 212b-1 and 212b-2 of the plurality of primary wirings 212 and receiving negative balance signals of the plurality of balance signals. Furthermore, as shown in FIG. 2C, the positive input pad 211a and the negative input pad 211b may include a first capacitor C1 formed therebetween, and first and second output pads 213a and 213b receiving an output from the secondary wiring unit 120 may include a second capacitor C2 formed therebetween. In addition, as shown in FIG. 2D, two positive primary wirings and two negative primary wirings may include two capacitors C each formed therebetween.

Further, when two power amplifying units (PAs) are provided and two primary wirings 212 are thus provided, a power of the signal input to the primary wiring 212 may be 33 dBm. Therefore, a frequency range of the signal may correspond to a high band. This configuration may be used in a mobile communications scheme such as a PCS, a distributed control system (DCS), or the like.

Referring to FIGS. 1 and 2B, the secondary wiring unit 120 may be formed on one surface of a printed circuit board having a predetermined width and be formed of a conductor. The secondary wiring unit 120 may include a secondary wiring 121 capable of being formed of a spiral conductor having a preset length, and the secondary wiring 121 may have one end connected to the ground pad GND and the other end connected to the output pad 122. The secondary wiring 121 may be spaced apart from the primary wirings 112 so that electromagnetic coupling may be formed therebetween, and have a width and a height of about 1.3 mm. Therefore, in order to electromagnetically couple the primary wirings 112 and the secondary wiring 112 to each other, the primary wiring 112 may have a width and a height of about 1.3 mm. The ground pad GND having one end of the secondary wiring 121 connected thereto may form the first notch filter 123 removing the second harmonic component with an inductance according to a length thereof.

Figure 3A:
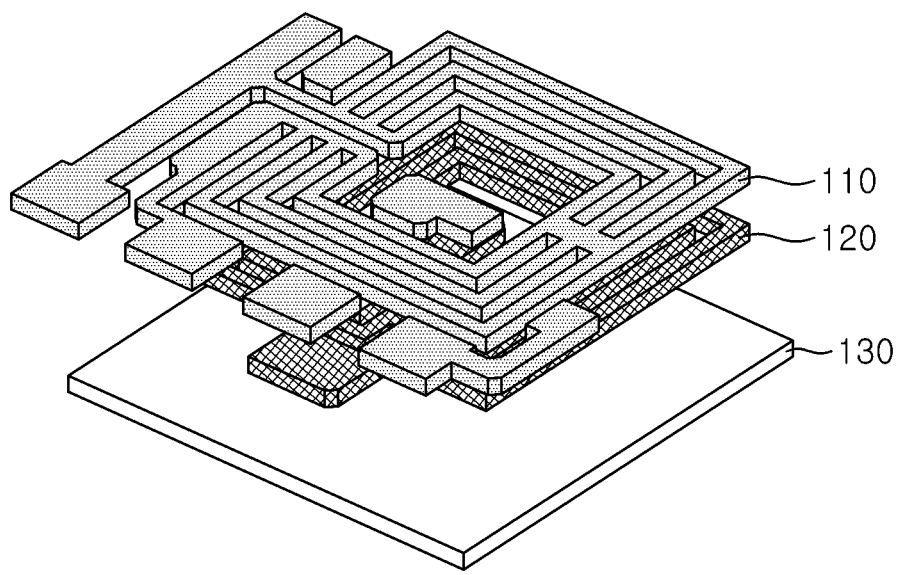
FIG. 3A is a schematic perspective view of a power combiner according to an embodiment of the present invention.
Figure 3B:
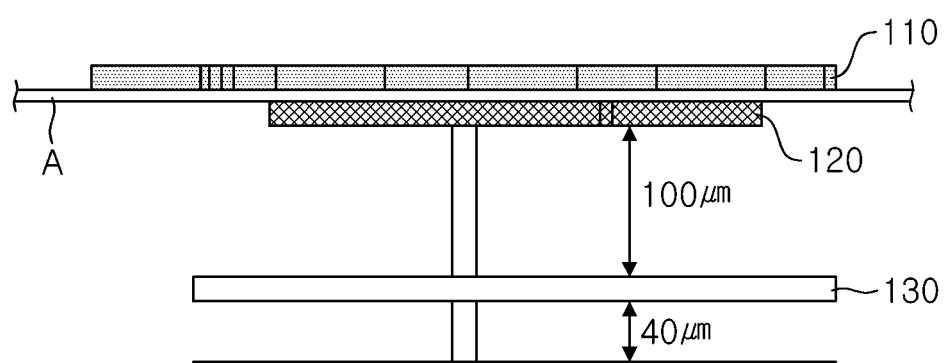
FIG. 3B is a side cross-sectional view of an embodiment of the power combiner according to the present invention.
Figure 3C:
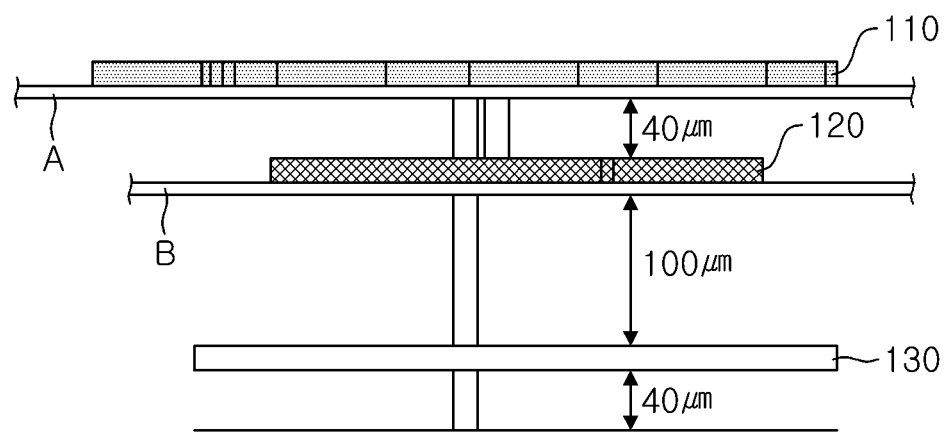
FIG. 3C is a side cross-sectional view of another embodiment of the power combiner according to the present invention.

FIG. 3A is a schematic perspective view of the power combiner according to an embodiment of the present invention, FIG. 3B is a side cross-sectional view of an embodiment of the power combiner according to the present invention, and FIG. 3C is a side cross-sectional view of another embodiment of the power combiner according to the present invention.

Referring to FIGS. 1, 2A through 2C, and 3A, the secondary wiring unit 120 may be positioned under the primary wiring unit 110 of the power combiner. A ground substrate 130 may be positioned under the secondary wiring unit 120. The primary wiring unit 110 and the secondary wiring unit 120 may be spaced apart from each other by an appropriate distance in order to electromagnetically couple the primary wiring 112 and the secondary wiring 121 to each other. As shown in FIG. 3B, the primary wiring unit 110 may be formed on an upper surface of a single printed circuit board A, the secondary wiring unit 120 may be formed on a lower surface thereof, and the ground substrate 130 may be positioned so as to be spaced apart from the secondary wiring unit 120 by about 100 μm. The ground substrate 130 may be spaced apart from the outside by about 40 μm.

In addition, according to another embodiment of the power combiner, as shown in FIG. 3C, the primary wiring unit 110 may be formed on an upper surface of a first printed circuit board A and the secondary wiring unit 120 may be formed on an upper surface of a second printed circuit board B positioned under the first printed circuit board A, such that the secondary wiring unit 120 and the primary wiring unit 110 may be spaced apart from each other by about 40 μm in order to electromagnetically couple the wirings to each other. Similarly to the above-mentioned embodiment, the ground substrate 130 may be positioned so as to be spaced apart from the secondary wiring unit 120 by about 100 μm. The ground substrate 130 may be spaced apart from the outside by about 40 μm.

Figure 4:
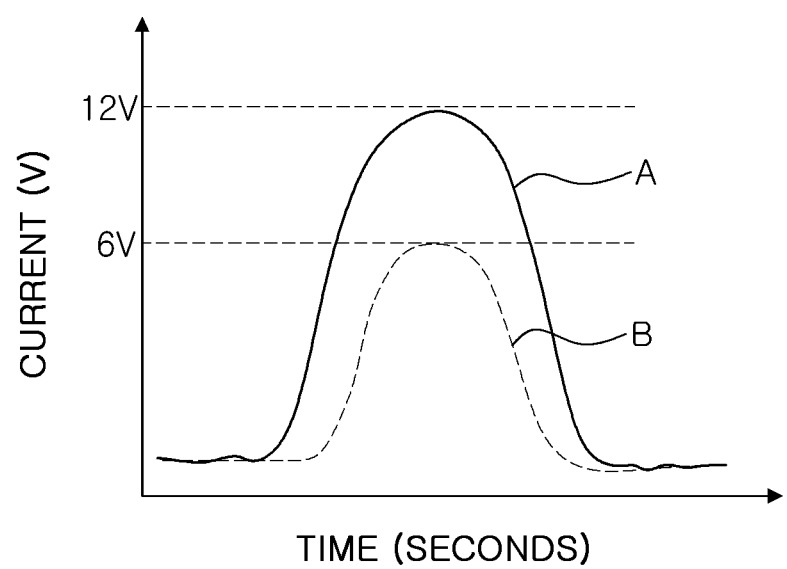
FIG. 4 is a graph showing electrical characteristics of the power combiner according to an embodiment of the present invention and power combiners according to the related art.
Figure 5A:
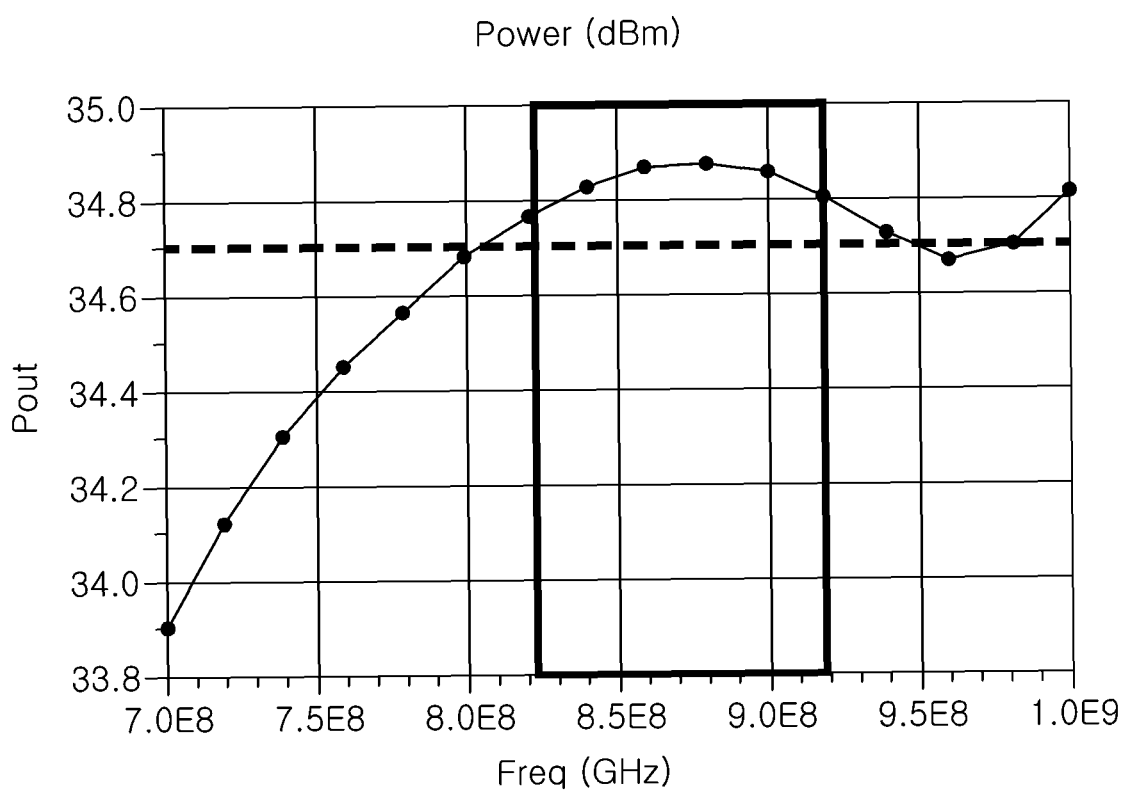
FIGS. 5A through 5D are graphs showing radio frequency (RF) characteristics of the power combiner according to an embodiment of the present invention.
Figure 5B:
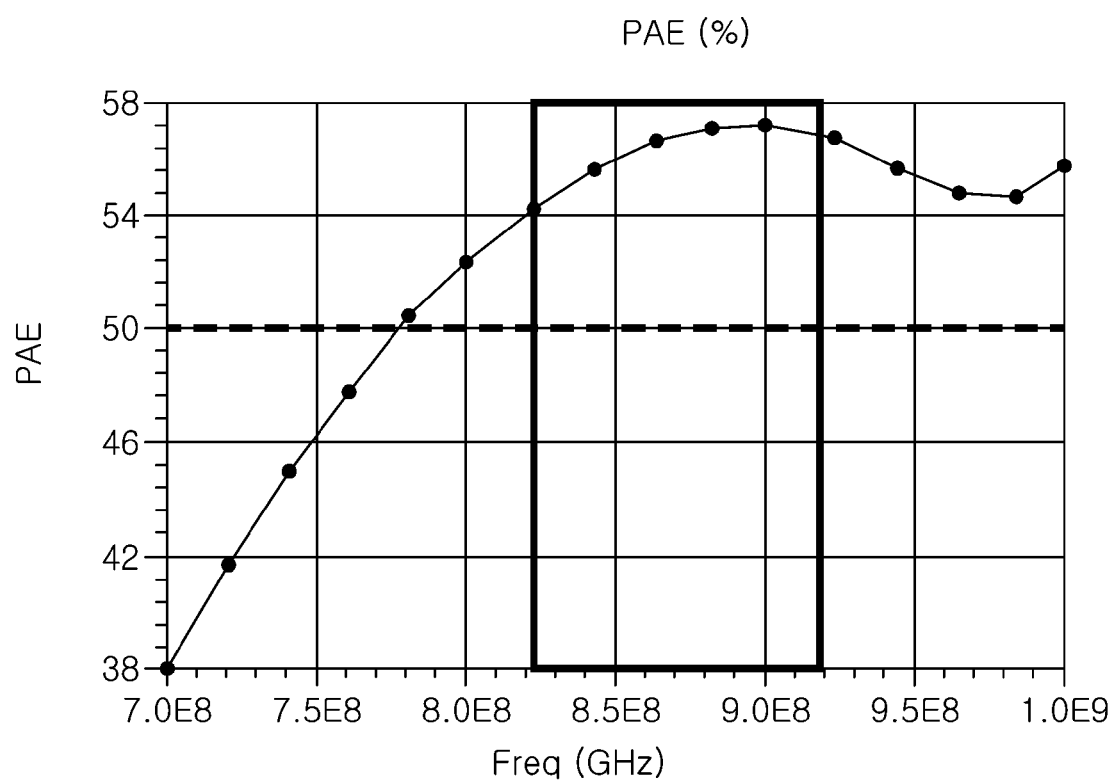
Figure 5C:
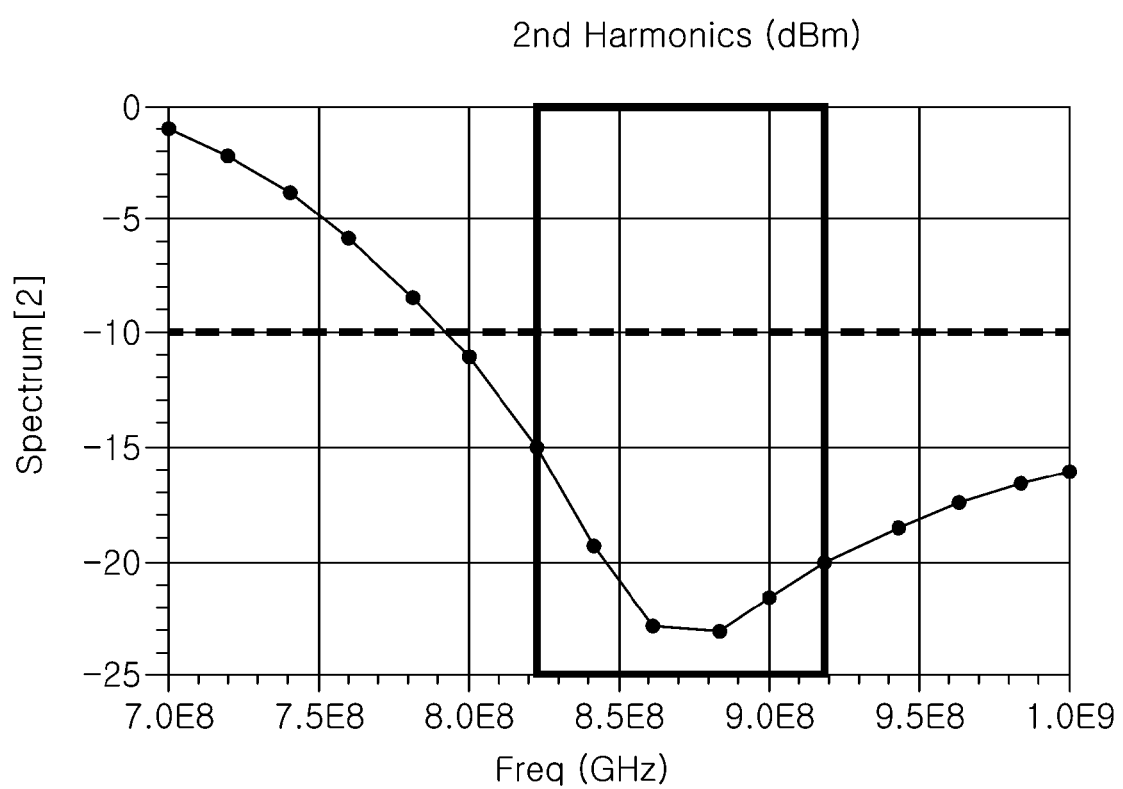
Figure 5D:
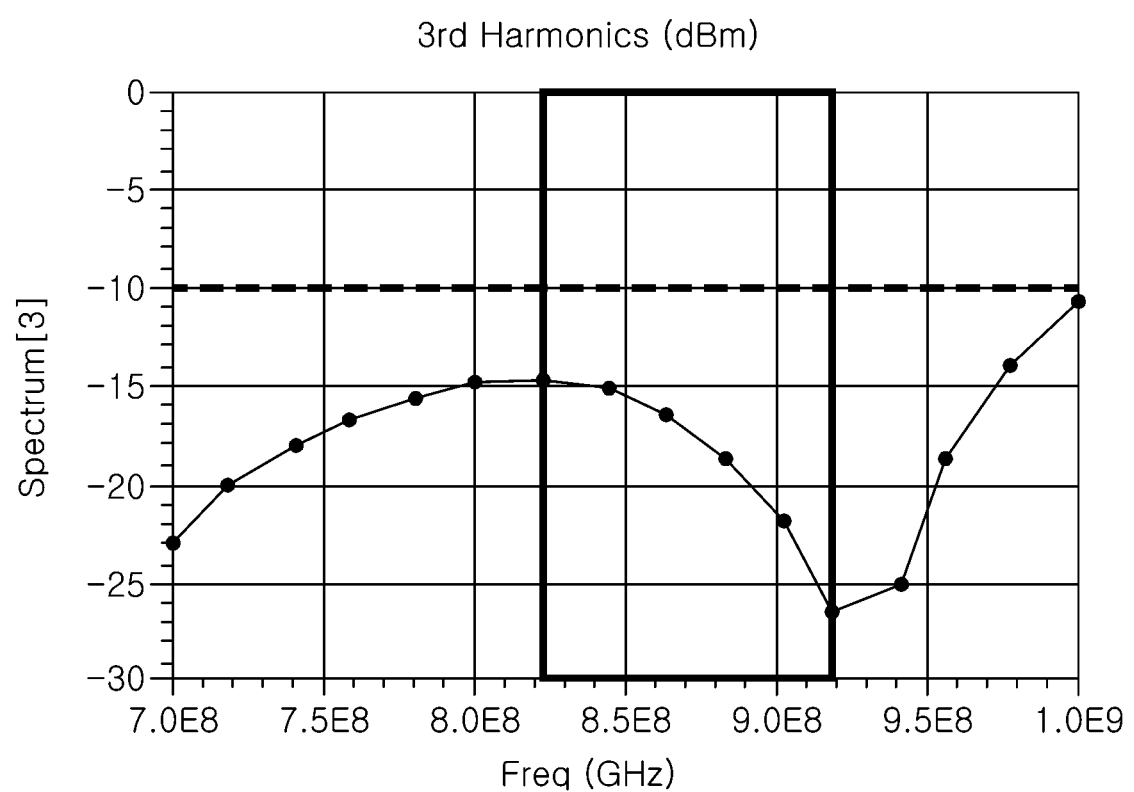

FIG. 4 is a graph showing electrical characteristics of the power combiner according to the embodiment of the present invention and the power combiner according to the related art.

As described above, the number of primary wirings 112 may correspond to the number of power amplifying units (PAs) and each of the plurality of primary wirings 112 may have an inductance value according to a length of a conductor. Therefore, as shown in reference sign 'A' of the graph, signal level swing of the balance signals from the power amplifying units (PAs) may be maintained.

On the other hand, unlike the present invention, when the power combiner in which the plurality of balance signals from the plurality of power amplifying units are input to a single primary wiring is formed on the printed circuit board, the inductance value according to a length of the primary wiring is small. Therefore, as shown in reference sign 'B' of the graph, signal level swing of the balance signals from the power amplifying units (PAs) becomes low, such that a power transfer function is deteriorated.

FIGS. 5A through 5D are graphs showing radio frequency (RF) characteristics of the power combiner according to the embodiment of the present invention.

Referring to FIGS. 5A through 5D, it may be appreciated that a power of an output single end signal is 34.7 dBm or more, a power efficiency (PAE) is 54% or more, and a second harmonic component and a third harmonic component are respectively, about −15 dBm or less, in a frequency band of 8.2 GHz to 9.3 GHz used in wireless communications such as a GSM, a general packet radio service (GPRS). This may satisfy the specification of a user requiring a power of 34 dBm or more, a power efficiency of 50% or more, and a second harmonic component and a third harmonic component of −10 dBm or less in the general wireless communications such as the GSM, the GPRS.

Figure 6:
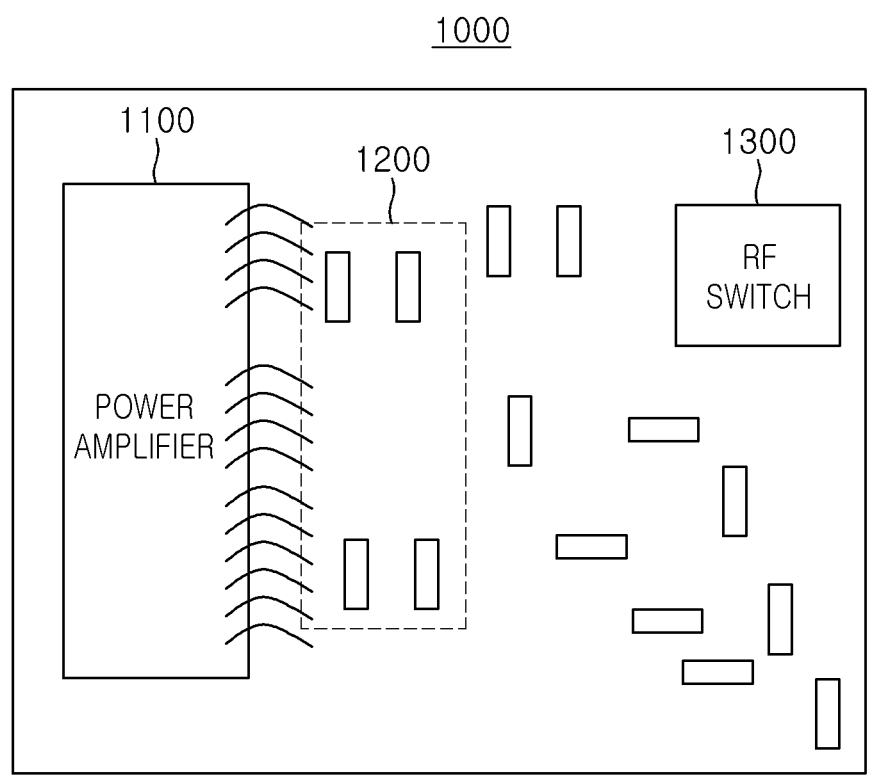
FIG. 6 is a view showing a schematic configuration of a signal transceiving module according to an embodiment of the present invention.

FIG. 6 is a view showing a schematic configuration of a signal transceiving module according to an embodiment of the present invention.

Referring to FIG. 6, a signal transceiving module 1000 according to an embodiment of the present invention may include the above-mentioned power amplifier 1100, the power combiner 1200 implemented by the printed circuit board, and a radio frequency (RF) switch 1300 switching between a transmission path of a single end signal from the power combiner 1200 and a path of a reception signal received from the outside.

As described above, according to the embodiment of the present invention, the power combiner is implemented on the printed circuit board without using the IPD power combiner, whereby manufacturing costs thereof may be reduced, a circuit area may be reduced, and a low efficiency and a deteriorated harmonic component in the amplifying element implemented through the CMOS process may be economically solved.

As set forth above, according to the embodiments of the present invention, manufacturing costs may be reduced, as compared to the power combiner implemented by the IPD transformer according to the related art, the power amplifying module having the same, and the signal transceiving module.

While the present invention has been shown and described in connection with the exemplary embodiments, it will be apparent to those skilled in the art that modifications and variations can be made without departing from the spirit and scope of the invention as defined by the appended claims.

What is claimed is:

1. A power combiner comprising:
a primary wiring unit formed on one surface of a printed circuit board, receiving a plurality of balance signals having a plurality of positive balance signals and a plurality of negative balance signals, and including a plurality of positive primary wirings each provided to correspond to the plurality of positive balance signals and a plurality of negative primary wirings each provided to correspond to the plurality of negative balance signals, wherein the plurality of positive primary wirings are spaced apart from each other by a predetermined interval, the plurality of negative primary wirings are spaced apart from each other by a predetermined interval, one end of each of the plurality of positive primary wirings is connected in common to the one end of each of the other positive primary wirings to thereby receive the plurality of positive balance signals, one end of each of the plurality of negative primary wirings is connected in common to the one end of each of the other negative primary wirings to thereby receive the plurality of negative balance signals, and the other end of each of the plurality of positive primary wirings and of each of the plurality of negative primary wirings is connected to the other end of each of the other positive primary wirings and negative primary wirings to thereby form a loop; and a secondary wiring unit formed on the other surface of the printed circuit board, the other surface being different from the one surface having the primary wiring unit formed thereon, and including a secondary wiring combining powers of the plurality of balance signals from the primary wirings forming the loop to thereby output a single end signal.

2. The power combiner of claim 1, wherein the primary wiring unit further includes an input pad having at least one positive input pad receiving the plurality of positive balance signals and transferring the plurality of positive balance signals to the one end of each of the positive primary wirings connected in common and at least one negative input pad receiving the plurality of negative balance signals.

3. The power combiner of claim 2, wherein the primary wiring unit further includes a first capacitor formed between the at least one positive input pad and the at least one negative input pad.

4. The power combiner of claim 2, wherein the primary wiring unit further includes a plurality of capacitors each formed between the plurality of positive primary wirings and the plurality of negative primary wirings.

5. The power combiner of claim 1, wherein the primary wiring unit further includes a connection pad through which the other ends of the plurality of positive primary wirings and the other ends of the plurality of negative primary wirings are connected to each other in common.

6. The power combiner of claim 5, wherein the connection pad has a preset driving power supplied thereto.

7. The power combiner of claim 1, wherein the secondary wiring unit further includes an output pad outputting the single end signal, and the secondary wiring has one end connected to a ground and the other end connected to the output pad.

8. The power combiner of claim 7, wherein the primary wiring unit further includes:
a first output pad electrically connected to the output pad of the secondary wiring unit;
a second output pad electrically connected to the ground through a bonding wire; and
a second capacitor formed between the first and second output pads.

9. The power combiner of claim 7, wherein a ground pad connected to one end of the secondary wiring has a preset inductance and forms a first notch filter removing a second harmonic component of the single end signal.

10. The power combiner of claim 8, wherein the bonding wire has a preset inductance and forms a second notch filter removing a third harmonic component of the single end signal.

11. The power combiner of claim 1, wherein the primary wiring unit is formed on an upper surface of the printed circuit board and the secondary wiring unit is formed on a lower surface thereof.

12. The power combiner of claim 1, further comprising first and second printed circuit boards,
wherein the primary wiring unit is formed on one surface of the first printed circuit board, the secondary wiring unit is formed on one surface of the second printed circuit board, and
the second printed circuit board is positioned to be spaced apart from a lower portion of the first printed circuit board by a predetermined distance.

13. The power combiner of claim 1, wherein the plurality of positive primary wirings of the primary wiring unit includes three positive primary wirings and the plurality of negative primary wirings of the primary wiring unit includes three negative primary wirings.

14. The power combiner of claim 1, wherein the plurality of positive primary wirings of the primary wiring unit includes two positive primary wirings and the plurality of negative primary wirings of the primary wiring unit includes two negative primary wirings.

15. A power amplifying module comprising:
a power amplifier including a plurality of amplifying units each receiving a plurality of balance signals having a plurality of positive balance signals and a plurality of negative balance signals and each amplifying the received plurality of balance signals; and
a power combiner including a primary wiring unit formed on one surface of a printed circuit board and including a plurality of positive primary wirings each provided to correspond to the plurality of positive balance signals and a plurality of negative primary wirings each provided to correspond to the plurality of negative balance signals, wherein the plurality of positive primary wirings are spaced apart from each other by a predetermined interval, the plurality of negative primary wirings are spaced apart from each other by a predetermined interval, one end of each of the plurality of positive primary wirings is connected in common to the one end of each of the other positive primary wirings to thereby receive the plurality of positive balance signals, one end of each of the plurality of negative primary wirings is connected in common to the one end of each of the other negative primary wirings to thereby receive the plurality of negative balance signals, and the other end of each of the plurality of positive primary wirings and of each of the plurality of negative primary wirings is connected to the other end of each of the other positive primary wirings and negative primary wirings to thereby form a loop, and a secondary wiring unit formed on the other surface of the printed circuit board, the other surface being different from the one surface having the primary wiring unit formed thereon, and including a secondary wiring combining powers of the plurality of balance signals from the primary wirings forming the loop to thereby output a single end signal.

16. The power amplifying module of claim 15, wherein the primary wiring unit further includes an input pad having at least one positive input pad receiving the plurality of positive balance signals and transferring the plurality of positive balance signals to the one end of each of the positive primary wirings connected in common and at least one negative input pad receiving the plurality of negative balance signals.

17. The power amplifying module of claim 16, wherein the primary wiring unit further includes a first capacitor formed between the at least one positive input pad and the at least one negative input pad.

18. The power amplifying module of claim 16, wherein the primary wiring unit further includes a plurality of capacitors each formed between the plurality of positive primary wirings and the plurality of negative primary wirings.

19. The power amplifying module of claim 15, wherein the primary wiring unit further includes a connection pad through which the other ends of the plurality of positive primary wirings and the other ends of the plurality of negative primary wirings are connected to each other in common.

20. The power amplifying module of claim 19, wherein the connection pad has a preset driving power supplied thereto.

21. The power amplifying module of claim 15, wherein the secondary wiring unit further includes an output pad outputting the single end signal, and the secondary wiring has one end connected to a ground and the other end connected to the output pad.

22. The power amplifying module of claim 21, wherein the primary wiring unit further includes:
   a first output pad electrically connected to the output pad of the secondary wiring unit;
   a second output pad electrically connected to the ground through a bonding wire; and
   a second capacitor formed between the first and second output pads.

23. The power amplifying module of claim 21, wherein a ground pad connected to one end of the secondary wiring has a preset inductance and forms a first notch filter removing a second harmonic component of the single end signal.

24. The power amplifying module of claim 22, wherein the bonding wire has a preset inductance and forms a second notch filter removing a third harmonic component of the single end signal.

25. The power amplifying module of claim 15, wherein the primary wiring unit is formed on an upper surface of the printed circuit board and the secondary wiring unit is formed on a lower surface thereof.

26. The power amplifying module of claim 15, wherein the power combiner further includes first and second printed circuit boards,
   the primary wiring unit is formed on one surface of the first printed circuit board,
   the secondary wiring unit is formed on one surface of the second printed circuit board, and
   the second printed circuit board is positioned to be spaced apart from a lower portion of the first printed circuit board by a predetermined distance.

27. The power amplifying module of claim 15, wherein the plurality of positive primary wirings of the primary wiring unit includes three positive primary wirings and the plurality of negative primary wirings of the primary wiring unit includes three negative primary wirings.

28. The power amplifying module of claim 15, wherein the plurality of positive primary wirings of the primary wiring unit includes two positive primary wirings and the plurality of negative primary wirings of the primary wiring unit includes two negative primary wirings.

29. A signal transceiving module comprising:
   a power amplifier including a plurality of amplifying units each receiving a plurality of balance signals having a plurality of positive balance signals and a plurality of negative balance signals and each amplifying the received plurality of balance signals;
   a power combiner including a primary wiring unit formed on one surface of a printed circuit board and including a plurality of positive primary wirings each provided to correspond to the plurality of positive balance signals and a plurality of negative primary wirings each provided to correspond to the plurality of negative balance signals, wherein the plurality of positive primary wirings are spaced apart from each other by a predetermined interval, the plurality of negative primary wirings are spaced apart from each other by a predetermined interval, one end of each of the plurality of positive primary wirings is connected in common to the one end of each of the other positive primary wirings to thereby receive the plurality of positive balance signals, one end of each of the plurality of negative primary wirings is connected in common to the one end of each of the other negative primary wirings to thereby receive the plurality of negative balance signals, and the other end of each of the plurality of positive primary wirings and of each of the plurality of negative primary wirings is connected to the other end of each of the other positive primary wirings and negative primary wirings to thereby form a loop, and a secondary wiring unit formed on the other surface of the printed circuit board, the other surface being different from the one surface having the primary wiring unit formed thereon, and including a secondary wiring combining powers of the plurality of balance signals from the primary wirings forming the loop to thereby output a single end signal; and
   a radio frequency (RF) switch switching between an output path of the single end signal output from the power combiner and a path of a reception signal received from the outside.

30. The signal transceiving module of claim 29, wherein the primary wiring unit further includes an input pad having at least one positive input pad receiving the plurality of positive balance signals and transferring the plurality of positive balance signals to the one end of each of the positive primary wirings connected in common and at least one negative input pad receiving the plurality of negative balance signals.

31. The signal transceiving module of claim 30, wherein the primary wiring unit further includes a first capacitor formed between the at least one positive input pad and the at least one negative input pad.

32. The signal transceiving module of claim 30, wherein the primary wiring unit further includes a plurality of capacitors each formed between the plurality of positive primary wirings and the plurality of negative primary wirings.

33. The signal transceiving module of claim 29, wherein the primary wiring unit further includes a connection pad through which the other ends of the plurality of positive primary wirings and the other ends of the plurality of negative primary wirings are connected to each other in common.

34. The signal transceiving module of claim 33, wherein the connection pad has a preset driving power supplied thereto.

35. The signal transceiving module of claim 29, wherein the secondary wiring unit further includes an output pad outputting the single end signal, and the secondary wiring has one end connected to a ground and the other end connected to the output pad.

36. The signal transceiving module of claim 35, wherein the primary wiring unit further includes:
   a first output pad electrically connected to the output pad of the secondary wiring unit;
   a second output pad electrically connected to the ground through a bonding wire; and
   a second capacitor formed between the first and second output pads.

37. The signal transceiving module of claim 35, wherein a ground pad connected to one end of the secondary wiring has a preset inductance and forms a first notch filter removing a second harmonic component of the single end signal.

38. The signal transceiving module of claim 36, wherein the bonding wire has a preset inductance and forms a second notch filter removing a third harmonic component of the single end signal.

39. The signal transceiving module of claim 29, wherein the primary wiring unit is formed on an upper surface of the printed circuit board and the secondary wiring unit is formed on a lower surface thereof.

40. The signal transceiving module of claim 29, wherein the power combiner further includes first and second printed circuit boards,
- the primary wiring unit is formed on one surface of the first printed circuit board,
- the secondary wiring unit is formed on one surface of the second printed circuit board, and
- the second printed circuit board is positioned to be spaced apart from a lower portion of the first printed circuit board by a predetermined distance.

41. The signal transceiving module of claim 29, wherein the plurality of positive primary wirings of the primary wiring unit includes three positive primary wirings and the plurality of negative primary wirings of the primary wiring unit includes three negative primary wirings.

42. The signal transceiving module of claim 29, wherein the plurality of positive primary wirings of the primary wiring unit includes two positive primary wirings and the plurality of negative primary wirings of the primary wiring unit includes two negative primary wirings.

* * * * *